(12) United States Patent
Agarwal

(10) Patent No.: US 7,546,519 B2
(45) Date of Patent: Jun. 9, 2009

(54) METHOD AND APPARATUS FOR DETECTING AND CORRECTING SOFT-ERROR UPSETS IN LATCHES

(75) Inventor: Kanak B. Agarwal, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 390 days.

(21) Appl. No.: 11/560,420

(22) Filed: Nov. 16, 2006

(65) Prior Publication Data

US 2008/0120525 A1     May 22, 2008

(51) Int. Cl.
    *H04L 1/08* (2006.01)
(52) U.S. Cl. .................... 714/823; 714/746
(58) Field of Classification Search ............... 327/215, 327/208, 210; 365/225.7; 716/4; 714/724, 714/823, 746
    See application file for complete search history.

(56) References Cited

U.S. PATENT DOCUMENTS

| | | | | |
|---|---|---|---|---|
| 6,380,781 | B1 * | 4/2002 | Karnik et al. | 327/215 |
| 6,724,676 | B1 * | 4/2004 | Schneider et al. | 365/225.7 |
| 6,954,912 | B2 * | 10/2005 | Srivastava et al. | 716/4 |
| 7,038,515 | B2 * | 5/2006 | Rusu et al. | 327/208 |
| 7,068,088 | B2 * | 6/2006 | Petersen | 327/208 |
| 7,323,920 | B2 * | 1/2008 | Naffziger | 327/210 |
| 7,415,645 | B2 * | 8/2008 | Drake et al. | 714/724 |

OTHER PUBLICATIONS

Y. Arima et al., "Cosmic-Ray Immune Latch Circuit for 90nm Technology and Beyond," IEEE Int'l. Solid-State Circuits Conf., Session 27.1 (Feb. 18, 2004).
T. Calin et al., "Upset Hardened Memory Deisng for Submicron CMOS Technology," IEEE Trans. on Nuclear Science, vol. 43, n. 6, pp. 2874-2878 (Dec. 1996).
T. Karnik, "Selective Node Engineering for Chip-Level Soft Error Rate Improvement," IEEE Symposium on VLSI Circuits, pp. 204-205 (2002).

\* cited by examiner

*Primary Examiner*—David Ton
(74) *Attorney, Agent, or Firm*—Casimer K. Salys; Jack V. Musgrove

(57) ABSTRACT

An error detection circuit for a latch precharges two dynamic nodes whose discharge paths are gated by true and complement storage nodes of the latch, such that one and only one of the dynamic nodes always discharges when the clock signal transitions from an active state to an inactive state. If a soft error flips the contents of the latch during storage mode the other dynamic node will discharge. A gate having inputs coupled to the dynamic nodes produces an error signal when both nodes have discharged. The error signal can then be used to select between true and complement outputs of the latch. The invention can be implemented in a more robust embodiment which examines the outputs of two error detection circuits to generate a combined error signal that ensures against false error detection when an upset occurs within one of the detection circuits.

20 Claims, 3 Drawing Sheets

METHOD AND APPARATUS FOR DETECTING AND CORRECTING SOFT-ERROR UPSETS IN LATCHES

BACKGROUND OF THE INVENTION

1. Field of the Invention

The present invention generally relates to data processing systems, and more particularly to a method and apparatus for detecting and correcting soft errors that arise in storage circuits such as latches.

2. Description of the Related Art

Data processing systems such as general-purpose computers or special-purpose devices have many different storage elements including memory arrays for mass storage of program instructions and operand data, and registers which temporarily store values used by execution units during the functional operation of the device. A typical microprocessor contains many storage elements that represent the current state or operating mode of the machine at any given time. These storage elements are very critical for correct operation of the processor and any error in the data stored in these elements can easily lead to machine failure. Microprocessors also use latches to store ancillary information, including scan latches that are employed in level-sensitive scan design (LSSD) type systems. These systems generally comply with the Institute of Electrical and Electronics Engineers (IEEE) standard 1149.1 pertaining to a test access port and boundary-scan architecture which allows information to be read from or written to the scan latches during operation of the data processing system.

Information stored in scan latches may include control, status or mode bits. For example, a data processing system might provide different mode configurations for clock control logic, and clock control latches can account for a significant portion of a microprocessor latch count. Microprocessors typically use control logic in local clock buffers to adjust the duty cycle and edge stressing of various clock pulses in the system and thereby meet the requirements of the local logic circuits. These clock buffer modes are set at system power-on using a scan controller, and often must maintain their logical value for days or months to ensure proper performance of the local logic circuits. However, these values can be upset during microprocessor operation due to a soft-error caused by stray radiation or electrostatic discharge. The upset may be correctable by scanning in a new value, but systems may only allow scanning in a limited manner such as at power-on, meaning that the system must be restarted if a clock control latch becomes incorrectly set.

Soft errors have become a primary reliability concern in scaled technologies. These errors are often caused by alpha particle strikes emitted from packaging materials or by neutrons originating from cosmic radiation. The soft-error rate (SER) of a data processing system can exceed the combined failure rate of all hard-reliability mechanisms (gate oxide breakdown, electro-migration, etc.). Built-in soft-error protection has thus become a necessity for meeting robustness targets in advanced computer systems. All storage elements (random-access memory, latches, etc.) are highly susceptible to soft-error induced failures, but memory arrays are usually protected by error-correction codes (ECCs) while latches are usually not so protected. Soft errors in latches are accordingly the primary contributors to overall system SER.

In one typical latch design data is stored in a cross-coupled inverter circuit. The state of this circuit is easily flipped by an alpha particle strike and in simple latches the data corruption occurs without detection. Once flipped, the state of the latch cannot be recovered. Combinational logic is typically more robust than sequential elements, i.e., static logic will eventually recover from an alpha strike, but a downstream error will arise if the temporary error induced in the logic arrives at a destination latch within the setup and hold time of that latch.

Conventional techniques for SER reduction in latches rely on three primary approaches: extra capacitances at the storage nodes, redundancy, and upset tolerance. Adding extra capacitance at a storage node improves soft-error resistance, but only by a minor amount. The extra capacitance also has the unfortunate side effect of introducing additional delay which can present significant difficulties for timing of the overall logic circuit. Robust latches have been designed with error-correction circuitry which relies on redundancy at either the latch level or the device (transistor) level. For example, two latches can be used with a comparator to provide error detection, and three latches can be used with a majority voting circuit for both detection and correction. The majority voting circuit indicates a set state for the redundant latch circuit based upon a majority of the latches being in the set state, or otherwise indicates a reset state. These latch designs reduce but do not eliminate the problem of upsets. For instance, in a redundant latch structure with a majority voting circuit that holds a logical state for an extended period, it is possible to have two separate upsets, i.e., two of the three latches being set to an incorrect value, which then generates an incorrect output at the voting circuit. As a related issue, full redundancy in latch designs may be too costly in terms of physical size (chip area), speed, and power consumption. In modern, leakage power-dominated designs, it becomes increasingly important to reduce or eliminate any unnecessary redundancies. Upset tolerant latches have been devised having more complex designs which are technically not redundant but still require many additional devices such as transistor pairs (p-type field effect transistors and/or n-type field effect transistors) having interwoven gates and output nodes. As with the redundancy approach, however, these designs can only recover from single event upsets (SEUs).

In light of the foregoing, it would be desirable to devise an improved circuit technique for detecting and correcting errors in storage elements such as latches which provides robust performance at a relatively low cost in terms of area, power and delay. It would be further advantageous if the circuit could provide soft-error immunity against multiple soft-error events.

SUMMARY OF THE INVENTION

It is therefore one object of the present invention to provide an improved latch circuit which can detect a soft error without the use of redundant latch elements.

It is another object of the present invention to provide such an improved latch circuit which has reduced or minimal overhead with regard to area, power and delay.

It is yet another object of the present invention to provide an efficient design for a latch having soft-error detection which further facilitates self-correction.

The foregoing objects are achieved in a method of detecting a soft error in a latch element, by precharging two dynamic nodes while driving the latch element with a data value when a clock signal is in a first state, selectively discharging one of the dynamic nodes based on the data value when the clock signal transitions from the first state to a second state, further discharging the other dynamic node in response to the soft error when the clock signal is in the second state, and activating an error signal when both of the nodes are discharged. The dynamic nodes are coupled to true and complement nodes of the latch element such that one and only one of the dynamic nodes always discharges when the clock signal transitions from the first state (active) to a second state (inactive) regardless of the data value. The error signal may be an output of a NAND gate whose inputs are coupled to the dynamic nodes. The latch output can then be corrected by using the error signal to control a multiplexer which selectively passes one of two true and complement outputs. The invention can be implemented in a more robust embodiment which examines the outputs of two error detection circuits to generate a combined error signal that ensures against false error detection when an upset occurs within one of the detection circuits.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED
EMBODIMENT(S)

Figure 1:
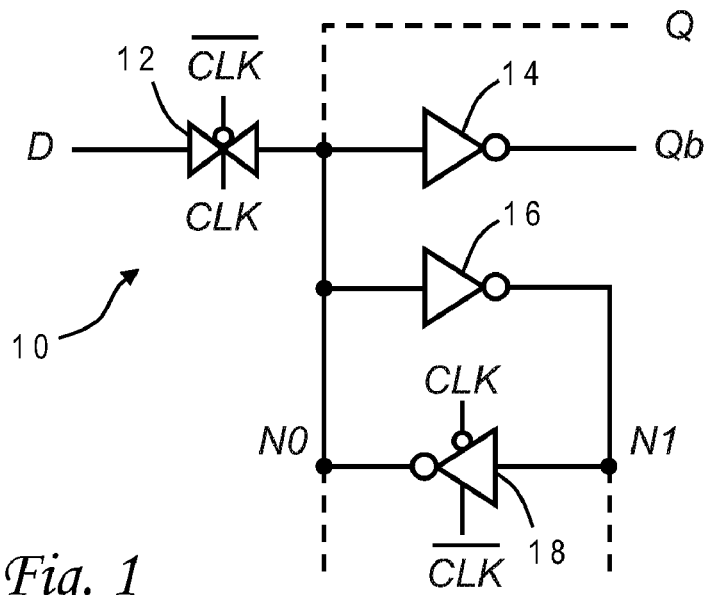
FIG. 1 is a schematic diagram of one embodiment of a latch element used in a latch circuit according to one implementation of the present invention.

With reference now to the figures, and in particular with reference to FIG. 1, there is depicted one embodiment 10 of a binary latch element constructed in accordance with the present invention. Latch element 10 is generally comprised of a tri-state clock-controlled inverter 12, an output inverter 14, and two cross-coupled inverters 16 and 18. Tri-state clock controlled inverter 12 is turned on when the clock signal is active (high voltage or logic "1"), and cross-coupled inverter 18 is turned on when the clock signal is inactive (low voltage or logic "0"). When the clock signal is active latch element 10 is in a transparent input mode wherein clock-controlled inverter 12 drives the data value D to the storage cell formed by cross-coupled inverters 16 and 18, and to output inverter 14 which further drives the latch output Qb. When the clock signal is inactive latch element 10 is in a storage mode wherein the incoming data is not driven, and the output is derived from the storage cell. Thus the latch element output in this embodiment is the inverted data value (complement) if the latch is operating correctly, i.e., if it has not experienced a soft error.

Figure 2:
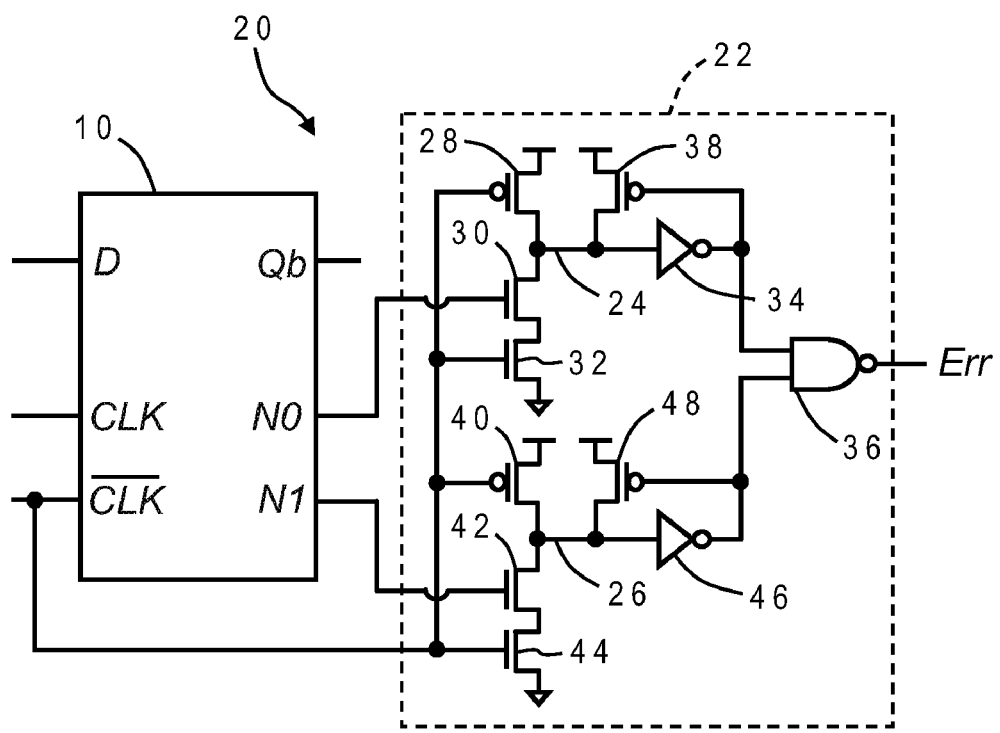
FIG. 2 is a schematic diagram of one embodiment of a latch circuit of the present invention having soft-error detection.

While the basic structure of latch element 10 as represented by solid lines in FIG. 1 is conventional, the present invention provides additional taps for one implementation as shown by dashed lines to enable signals that are used to detect and correct any soft error arising in the latch. One tap is made at the input to output inverter 14 so that a second output Q (true) is provided for the latch, which is utilized for error correction as explained below in conjunction with FIGS. 4 and 5. Two other taps are made at the storage nodes N0 and N1 of cross-coupled inverters 16 and 18. These two taps are used as inputs to an error detection circuit that is shown in FIG. 2. Alternative implementations can provide these signals using different taps or circuit elements, for example by connecting another inverter to output inverter 14 with the output of the added inverter being the true output Q.

A soft error arising in cross-coupled inverters 16, 18 is not a problem when the clock is active since the clock-controlled inverter will keep driving the storage cell and the latch output. A problem only arises during storage mode when the data input is turned off. During this time, if an alpha particle strikes at either storage node N0 or N1, it will change the state of the storage cell and reverse the output of the latch. This incorrect output could propagate to critical registers and possibly cause a system failure.

Referring now to FIG. 2, latch element 10 is shown as a component of one embodiment of a larger data storage circuit 20 constructed in accordance with the present invention which additionally includes a soft-error detection circuit 22. Detection circuit 22 receives as inputs the signals from storage nodes N0 and N1 as well as the inverted clock signal. Detection circuit 22 has two dynamic nodes 24, 26 which are respectively coupled to storage nodes N0 and N1. Dynamic node 24 is connected to the power supply voltage ($V_{dd}$) by a p-type field effect transistor (pfet) 28 whose gate is controlled by the inverted clock signal. Dynamic node 24 is also connected to electrical ground by two n-type field effect transistors (nfets) 30, 32 in series. The gate of nfet 30 is controlled by signal N0, and the gate of nfet 32 is controlled by the inverted clock signal. Dynamic node 24 drives the input of an inverter 34 whose output is connected to one input of a NAND gate 36 and to the gate of another pfet 38 which connects dynamic node 24 to the power supply voltage. Dynamic node 26 is connected to the power supply voltage by a pfet 40 whose gate is controlled by the inverted clock signal. Dynamic node 26 is also connected to electrical ground by two nfets 42, 44 in series. The gate of nfet 42 is controlled by signal N1, and the gate of nfet 44 is controlled by the inverted clock signal. Dynamic node 26 drives the input of another inverter 46 whose output is connected to the other input of NAND gate 36 and to the gate of another pfet 48 which connects dynamic node 26 to the power supply voltage.

The error-detection mechanism of circuit 22 begins by precharging the dynamic nodes 24, 26 to the power supply voltage when the latch is transparent (CLK=1). During this clock phase pfets 28 and 40 are conducting and nfets 32 and 44 are nonconducting so the dynamic nodes are precharged to $V_{dd}$. As the clock transitions to the inactive state one and only one of the dynamic nodes will immediately discharge depending upon the particular value of D. For example, if D=1 then the true signal from N0 will turn on nfet 30 thereby discharging dynamic node 24 to ground since nfet 32 will also be conducting (CLK=0), and the input of inverter 34 will likewise be pulled low to switch pfet 38 to a nonconducting state. During this clock phase the other dynamic node 26 will not discharge as long as the complement signal from N1 remains low, which keeps nfet 42 in a nonconducting state. However, if a soft error occurs when latch element 10 is in the storage mode and upsets (flips) the state of the storage cell, the complement signal from N1 will go high causing nfet 42 to conduct and discharge dynamic node 26. After this upset the outputs of both inverters 34, 46 will be high, switching the output of NAND gate 36. NAND gate 36 is accordingly used to determine when both of the nodes have discharged and its output is an error signal Err which, in this embodiment, is considered active at the low voltage (logical 0). Those skilled in the art will appreciate that other logic gates can be used besides NAND gate 36 and inverters 34, 36 to provide the error signal, and in an alternative embodiment the error signal may be considered active at the high voltage. The same analysis can be carried out for D=0, the only difference being which dynamic node 24, 26 discharges first.

Figure 3:
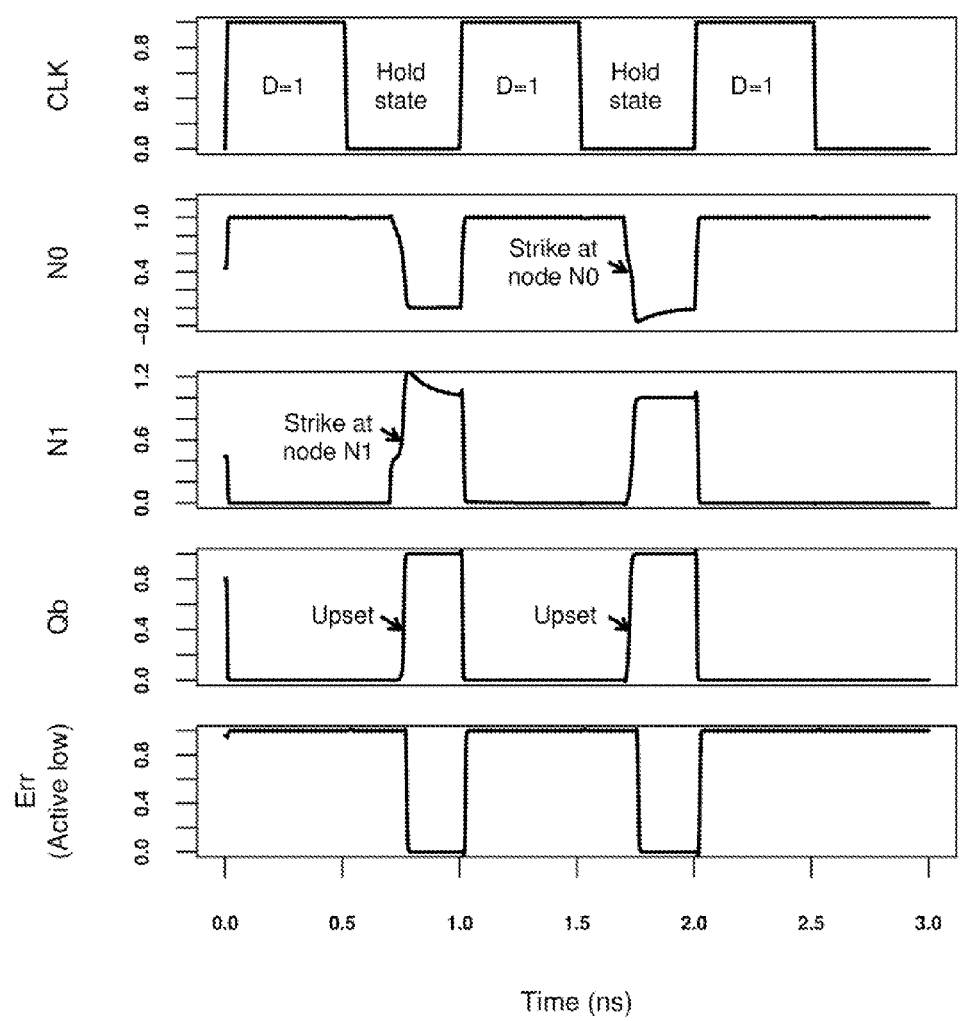
FIG. 3 is a timing diagram illustrating various signals for the latch circuit of FIG. 2 as two upsets (e.g., alpha particle strikes) occur over three clock cycles.

The operation of latch circuit 20 may be further understood with reference to the timing diagram of FIG. 3 wherein the clock is a one gigahertz signal and the y-axis values represent power supply voltage. This example shows three clock cycles with two soft errors occurring during the first and second cycles, for a constant input value D=1. At the beginning of the first clock cycle the clock signal goes high and drives the data value to the latch storage cell, making node N0 go high and making node N1 go low, and also drives the data value to the output inverter making output Qb go low; at this time the error signal is high, i.e., inactive. The clock signal transitions to its low state at the second half of the first clock cycle and the logical values of N0, N1, Qb and Err remain the same until an alpha strike occurs at node N1 near the end of the first clock cycle. This strike causes the state of node N1 to flip to high which in turn causes the state of node N0 to flip to low, and output Qb flips to high. As explained above, this state change will also result in both inputs of NAND gate 36 turning on, which flips Err to its low (active) state. During the second clock cycle the storage cell is reset to the data value with the same signals as just described, until a second alpha strike occurs at node N0 near the end of the second clock cycle. This strike similarly flips the states of signals N0, N1, Qb and Err. The third clock cycle shows normal (non-upset) operation of the latch, during which the error signal remains high (inactive).

The soft-error detection mechanism of the present invention thus provides a robust method of dynamically confirming the output of the latch with very little performance overhead. There is no extra logic in the critical path (the data path from input D to output Qb), and the taps add very little capacitance at the latch nodes. Although the detection logic requires additional devices, the extra area overhead is relatively small.

Figure 4:
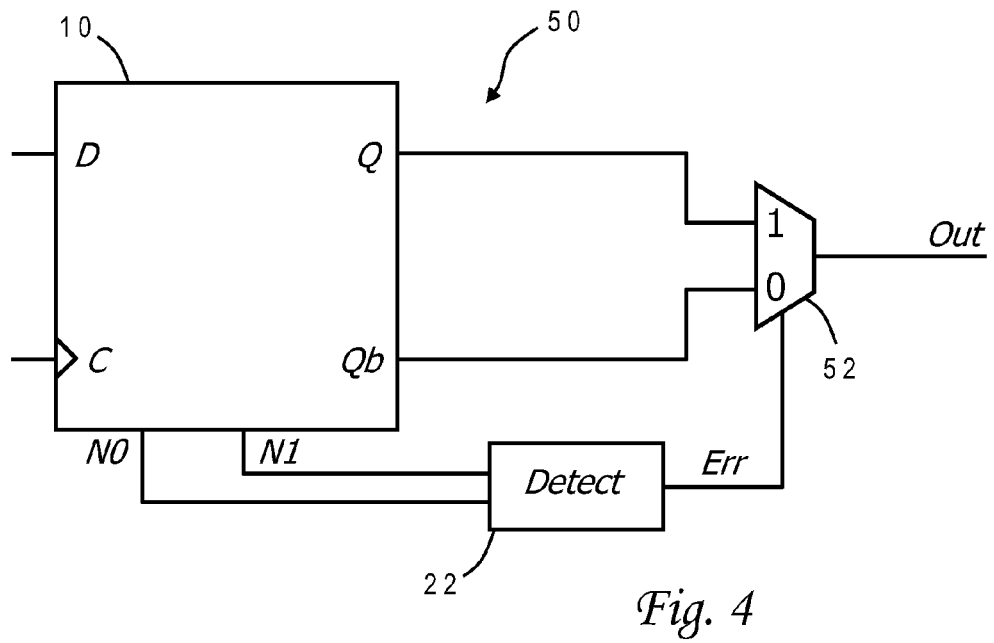
FIG. 4 is a schematic diagram of one embodiment of a self-correcting latch circuit constructed in accordance with the present invention.

The present invention further provides an efficient design for a latch having soft-error detection which in turn facilitates self-correction. Since the error signal indicates that the contents of the storage cell have been inverted, it can be used to select between true (Q) and complement (Qb) outputs of the latch and thereby output the proper data value. In other words, when the error signal is active the latch simply re-inverts the data value. FIG. 4 illustrates one embodiment of a self-correcting latch 50 which employs the present invention. Self-correcting latch 50 includes latch element 10, soft-error detection circuit 22 and a multiplexer 52 whose select line is connected to the error signal from detection circuit 22 (i.e., the output of NAND gate 36). The inputs of multiplexer 52 are connected respectively to signals Q and Qb. In this implementation multiplexer 52 passes signal Q when the error signal/select is high (logical 1), and passes signal Qb when the error signal/select is low (logical 0). Thus, for the embodiment of detection mechanism 22 which considers the error signal to be active when low, self-correcting latch 50 will output the true signal Q when no error is detected and will output the complement signal Qb when an error is detected.

Figure 5:
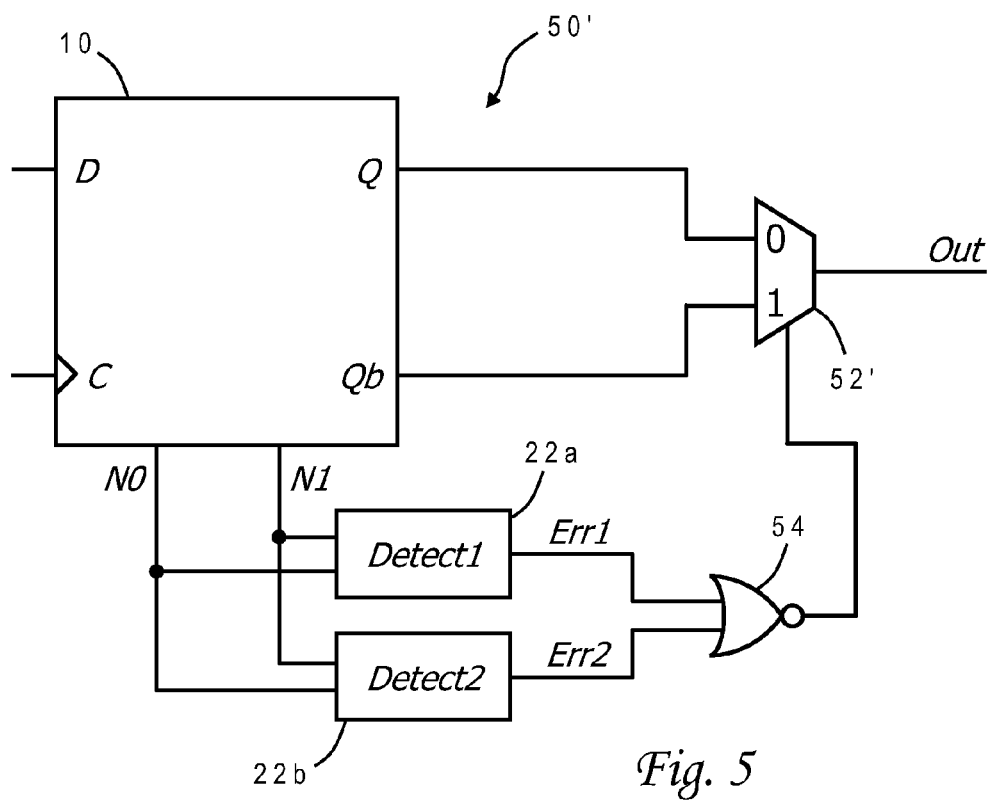
FIG. 5 is a schematic diagram of another embodiment of a self-correcting latch circuit constructed in accordance with the present invention.

The operation of self-correcting latch 50 presumes that any upset event will occur at the storage nodes of the latch element and not within the detection logic, or that any event discharging either of the dynamic nodes 24, 26 would also flip the contents of the storage cell. However, an alpha particle strike might discharge a dynamic node during storage mode without affecting the storage cell, in which case the circuit would mistakenly detect an error and produce an incorrect latch output. The invention may be implemented in an alternative design to guard against such an event. FIG. 5 depicts an alternative embodiment for a self-correcting latch 50' adapted for this possibility. Self-correcting latch 50' includes latch element 10 and two identical detection circuits 22a and 22b which receive the same inputs N0 and N1. Detection circuits 22a and 22b produce two error signals Err1 and Err2 whose logical values correspond to the states given in Table 1.

TABLE 1

| Err1 | Err2 | State |
| --- | --- | --- |
| 1 | 1 | no error |
| 0 | 1 | error in detection logic |
| 1 | 0 | |
| 0 | 0 | error in latch element |

The two error outputs may be combined using a NOR gate 54 which provides a final error signal that is used to control multiplexer 52'. For this embodiment, multiplexer 52' passes the true signal Q when the select line is low, and passes the complement signal Qb when the select line is high.

The present invention thus allows excellent soft-error immunity for a latch circuit, and can detect errors even in the case of multiple radiation strikes. Latch circuits constructed in accordance with the present invention not only have low area and performance overhead, but are further easy to implement as they do not require any re-design of existing latch elements. The detection and correction circuits may be selectively attached to the critical latches such as control registers.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, while the invention has been disclosed in the context of a specific latch design having cross-coupled inverters, it is more generally applicable to any latch design which has true and complement nodes. It is therefore contemplated that such modifications can be made without departing from the spirit or scope of the present invention as defined in the appended claims.

What is claimed is:

1. A method of detecting a soft error in a latch element, comprising:
   precharging two dynamic nodes while driving the latch element with a data value when a clock signal is in a first state;
   selectively discharging a first one of the dynamic nodes based on the data value when the clock signal transitions from the first state to a second state;
   further discharging a second one of the dynamic nodes in response to the soft error when the clock signal is in the second state; and
   activating an error signal when both of the nodes are discharged.

2. The method of claim 1 wherein the error signal is an output of a NAND gate whose inputs are coupled to the dynamic nodes.

3. The method of claim 1 wherein the dynamic nodes are coupled to true and complement nodes of the latch element such that one and only one of the dynamic nodes always discharges when the clock signal transitions from the first state to a second state regardless of the data value.

4. The method of claim 3 wherein the dynamic nodes are precharged by p-type field effect transistors connected to a power supply voltage and gated by an inverse of the clock signal.

5. The method of claim 3 wherein the latch element has cross-coupled inverters forming the true and complement nodes.

6. The method of claim 3, further comprising correcting the soft error by using the error signal to selectively pass one of two true and complement outputs.

7. The method of claim 6 wherein the error signal controls a multiplexer that passes the true output when the error signal is active.

8. A data storage circuit comprising:
a latch element having true and complement storage nodes;
a first dynamic node having a discharge path gated by said true storage node;
a second dynamic node having a discharge path gated by said complement storage node; and
means for determining when said first and second dynamic nodes are both discharged.

9. The data storage circuit of claim 8 wherein said determining means includes a NAND gate whose inputs are coupled to said first and second dynamic nodes.

10. The data storage circuit of claim 8 wherein said latch element has cross-coupled inverters forming said true and complement storage nodes.

11. The data storage circuit of claim 8 wherein said first and second dynamic nodes are precharged during a first clock phase and can only discharge during a second clock phase.

12. The data storage circuit of claim 11 wherein said first and second dynamic nodes are precharged by first and second p-type field effect transistors connected to a power supply voltage and gated by an inverse of a clock signal that drives said latch element.

13. The data storage circuit of claim 8 wherein said determining means produces an error signal, and further comprising means for selectively passing one of two true and complement outputs of said latch element based on the error signal.

14. The data storage circuit of claim 13 wherein said passing means includes a multiplexer that passes the true output when the error signal is active.

15. A self-correcting latch circuit comprising:
a latch element having true and complement storage nodes, and true and complement outputs;
an error detection circuit having first and second dynamic nodes which are precharged during a first clock cycle and have discharge paths which discharge only during a second clock cycle and are respectively gated by said true and complement storage nodes, and a gate having inputs coupled to said first and second dynamic nodes which produces an error signal when said dynamic nodes are both discharged; and
means for selecting a latch output from said true and complement outputs based on the error signal.

16. The self-correcting latch circuit of claim 15 wherein said latch element has cross-coupled inverters forming said true and complement storage nodes.

17. The self-correcting latch circuit of claim 15 wherein said first and second dynamic nodes are precharged by first and second p-type field effect transistors connected to a power supply voltage and gated by an inverse of a clock signal that drives said latch element.

18. The self-correcting latch circuit of claim 15 wherein said gate is a NAND gate, and said first and second dynamic nodes are connected to respective inputs of said NAND gate by first and second inverters.

19. The self-correcting latch circuit of claim 15 wherein said selecting means is a multiplexer that passes the true output when the error signal is active.

20. The self-correcting latch circuit of claim 15 wherein said error detection circuit is a first error detection circuit which produces a first error signal, and further comprising:
a second error detection circuit having third and fourth dynamic nodes which are precharged during the first clock cycle and have discharge paths which discharge only during the second clock cycle and are respectively gated by said true and complement storage nodes, and another gate having inputs coupled to said third and fourth dynamic nodes which produces a second error signal when said third and fourth dynamic nodes are both discharged; and
means for producing a final error signal responsive to the first and second error signals, wherein the final error signal controls said selecting means.

* * * * *